(12) United States Patent
Kishida et al.

(10) Patent No.: US 7,582,160 B2
(45) Date of Patent: Sep. 1, 2009

(54) SILICONE SINGLE CRYSTAL PRODUCTION PROCESS

(75) Inventors: Yutaka Kishida, Chiba (JP); Seiki Takebayashi, Chiba (JP); Teruyuki Tamaki, Chiba (JP)

(73) Assignee: Siltronic AG, Munich (DE)

( * ) Notice: Subject to any disclaimer, the term of this patent is extended or adjusted under 35 U.S.C. 154(b) by 392 days.

(21) Appl. No.: 11/451,989

(22) Filed: Jun. 13, 2006

(65) Prior Publication Data

US 2006/0283378 A1    Dec. 21, 2006

(30) Foreign Application Priority Data

Jun. 15, 2005    (JP)    ............... 2005-175593

(51) Int. Cl.
*C30B 15/00*    (2006.01)
(52) U.S. Cl. ............... 117/15; 117/11; 117/13; 117/14; 117/19; 117/20; 117/916; 117/931; 117/932
(58) Field of Classification Search .......... 117/11, 117/13, 14, 15, 19, 20, 916, 931, 932
See application file for complete search history.

(56) References Cited

U.S. PATENT DOCUMENTS

| | | | | |
|---|---|---|---|---|
| 5,260,037 A | * | 11/1993 | Kitaura et al. | ............... 117/217 |
| 6,136,090 A | * | 10/2000 | Araki et al. | ............... 117/13 |
| 2003/0051658 A1 | | 3/2003 | Nakagawa et al. | |

FOREIGN PATENT DOCUMENTS

| EP | 0 776 997 A1 | 6/1997 |
|---|---|---|
| JP | 05-262593 | 10/1993 |
| JP | 06-172081 | 6/1994 |
| JP | 06-219887 | 8/1994 |
| JP | 06-298593 | 10/1994 |
| JP | 09-157085 | 6/1997 |
| JP | 10-167881 | 6/1998 |
| JP | 56-125296 | 10/1998 |

(Continued)

OTHER PUBLICATIONS

Patent Abstracts of Japan, English Abstract and Computer Translation of JP 06-172081 (1994).*

(Continued)

*Primary Examiner*—Robert M Kunemund
*Assistant Examiner*—Matthew J Song
(74) *Attorney, Agent, or Firm*—Brooks Kushman P.C.

(57) ABSTRACT

In silicon single crystal growth by the Czochralski method using a quartz crucible, a silicon single crystals with a uniform distribution of oxygen concentration can be produced in high yield without being affected by changes of crystal diameter and initial amount of melt feedstock. The oxygen concentration is adjusted by estimating oxygen concentration during growth on the basis of a relationship among three parameters: crucible rotation rate ($\Omega$), crucible temperature (T), and the ratio ($\beta$) of contact area of molten silicon with the inner wall of the crucible and with atmospheric gas, and by associating the temperature (T) with the ratio ($\beta$) by the function $1/\beta \times \mathrm{Exp}(-E/T)$ where E is the dissolution energy (E) of quartz into molten silicon to control at least one of the rotation rate ($\Omega$) and temperature (T) to conform the estimated oxygen concentration to a target concentration.

8 Claims, 10 Drawing Sheets

FOREIGN PATENT DOCUMENTS

JP        2000-203987 A1     7/2000

OTHER PUBLICATIONS

Hoshikawa and Hirata, Oxygen Incorporation and Melt Convection in CZ Silicon Crystal Growth, Journal of the Japanese Association for Crystal Growth vol. 15.2 1988 p. 215.

T. Carlberg, Calculated Solubilities of Oxygen in Liquid and Solid Silicon, J. Electrochem. Soc., vol. 133, No. 9 p. 1940.

JP 06316481 A, cited in European Search Report, English Patent Abstract of Japan, Nov. 15, 1994.

Patent Abstract Corresponding to JP 2000-203987.

Susumu Maeda et al., Oxygen concentration in Czochralski silicon crystals depending on silicon monoxide evaporation from boron doped silicon melts, Journal of Crystals Growth, Elsevier, Amsterdam, NL, vol. 192 (1998), pp. 117-124.

* cited by examiner

SILICONE SINGLE CRYSTAL PRODUCTION PROCESS

BACKGROUND OF THE INVENTION

1. Field of the Invention

The present invention relates to production techniques for the manufacture of silicon single crystals by the Czochralski method (hereinafter referred to as the CZ method).

2. Background Art

Oxygen in a silicon wafer improves the operating characteristics of semiconductor devices by trapping contaminant atoms brought into the wafer during device fabrication processes (intrinsic gettering). Thus, the oxygen concentration in a silicon single crystal has to be kept within a given range throughout the constant diameter portion of the crystal.

Oxygen introduced into the silicon single crystal is derived from contact of the surface of the quartz crucible and the molten silicon. In the conventional CZ method, the oxygen concentration is not uniform in the pull direction. The reasons for this non-uniformity are believed to be as follows: (1) the change in contact area between the quartz crucible and the melt due to decreased volume of melt in the crucible as the crystal grows, (2) a change of the amount of oxygen eluted from crucible due to temperature changes resulting from the furnace environment during crystal pulling, and (3) a change in oxygen transport efficiency into the crystal due to changes in melt flow. However, no quantitative experimental support for these three factors have been reported, so their contribution to the oxygen concentration in the crystal is still not clear. On the other hand, in actual production of silicon single crystals, several methods have been proposed to alter the oxygen concentration with respect to solidification rate or crystal length. These methods include adjusting the crucible rotation rate, the pressure in the furnace, the flow rate of atmospheric gas, application of static magnetic fields, or combinations of several of these parameters, hereinafter referred to as "operational parameters." Use of such parameters is disclosed in Japanese unexamined published patent applications H05-262593, H06-172081, H09-157085, and H10-167881.

It is theoretically possible to adjust the oxygen concentration in the crystal by adjusting one or more of the operational parameters. To accomplish this, however, crystals must be pulled under different conditions of operational parameters to establish a relationship between oxygen concentration and the various operational parameters. Thus, a great deal of effort is required to determine satisfactory adjustment procedures of the operational parameters during crystal growth. However, as shown in published application H09-157085, costly redetermination of vexatious operational parameters associated with component deterioration or product change are necessary, for example, in the case that a quality standard of the crystal is changed, a production furnace is replaced, a furnace part such as insulation or heater is changed, or the amount of molten feedstock is increased. Even without such changes, when the furnace ages, or the temperature environment within the furnace changes due to the deterioration of furnace members etc., the crystal oxygen concentration is affected thereby. Additionally, the recent scale up of silicon single crystal diameters from 8 to 12 inches which, of course, also involved scale up of the furnace, has exponentially increased both the cost as well as the time spent in experimental crystal pulling in order to satisfactorily adjust oxygen concentration. Thus, the conventional trial and error method leaves much to be desired when new quality standards or changes of operational environment are necessitated.

SUMMARY OF THE INVENTION

An object of the present invention is to improve upon the conventional methods, and thus to provide a production process for obtaining a silicon single crystal with a uniform oxygen concentration which allows a flexible response to production of wafers of new quality standards, to changes in the operational environment process, scale up, and the like.

DETAILED DESCRIPTION OF THE PREFERRED EMBODIMENT(S)

Figure 1:
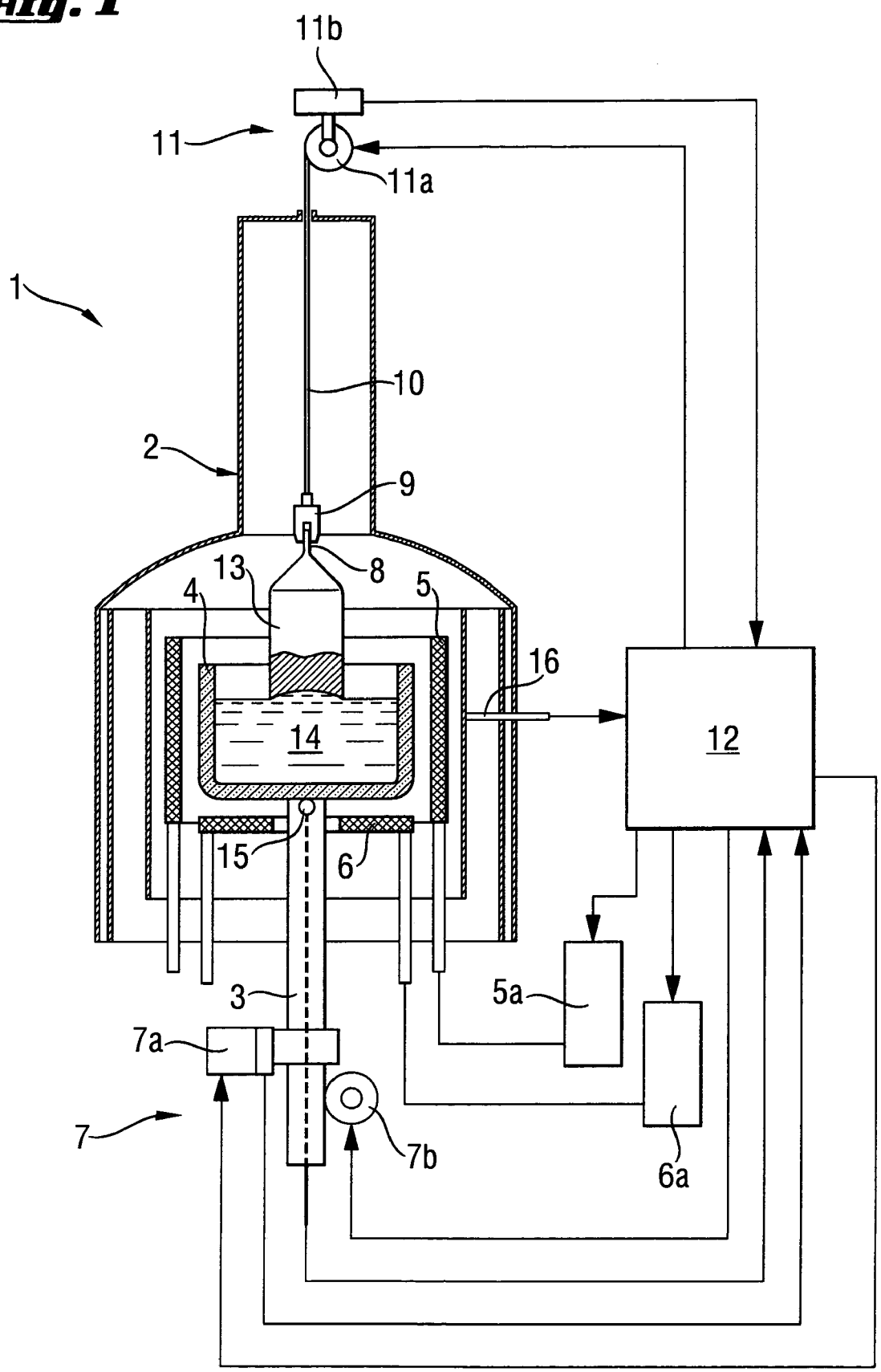
FIG. 1 is a schematic view depicting one embodiment of a production apparatus used in the production of silicon single crystals according to the present invention.

The invention pertains to a production process for producing single crystal silicon by the Czochralski method using a quartz crucible, comprising estimating an oxygen concentration during growth of a silicon single crystal on the basis of the three parameters: crucible rotation rate ($\Omega$), crucible temperature (T), and contact area ratio ($\beta$) of molten silicon with an inner wall of the crucible and the contact area of molten silicon with an atmospheric gas; and controlling at least one of the crucible rotation rate ($\Omega$) and/or the crucible temperature (T) to conform the estimated oxygen concentration to a target concentration.

A further aspect of the invention is a production process for silicon single crystals wherein the oxygen concentration in a silicon single crystal is controlled by associating the temperature (T) with the ratio ($\beta$) by the function $1/\beta \times \mathrm{Exp}(-E/T)$, wherein E is the dissolution energy of quartz into molten silicon. Yet further aspects of the invention are a production process for silicon single crystals wherein the rotation rate ($\Omega$) is controlled in response to changes of the ratio ($\beta$) and the temperature (T), and a production process wherein power supplied to a heater heating the crucible is controlled in response to changes of the rotation rate ($\Omega$) and the ratio ($\beta$).

A further embodiment of the invention involves controlling the relative position between the crucible and the crucible heater in response to changes of the rotation rate ($\Omega$) and the ratio ($\beta$). In a yet further embodiment, the growth rate of a silicon single crystal is controlled in response to changes of the rotation rate ($\Omega$) and the ratio ($\beta$).

In the present invention, among the many potential controllable parameters in the production of silicon single crystal by the Czochralski method using a quartz crucible, three parameters: T, $\beta$, and $\Omega$, are the principle factors which determine the oxygen concentration of the crystal, and these parameters are independent of component deterioration and product change. Once again, these factors are defined as:

T: crucible temperature;

$\beta$: ratio of contact area=contact area of molten silicon with an atmospheric gas/contact area of molten silicon with an inner wall of crucible; and $\Omega$: crucible rotation rate.

Crucible temperature T as a first parameter is an average temperature of a part of a quartz crucible in contact with the liquid surface of molten silicon. By the temperature T, the amount of oxygen eluted from the surface of quartz crucible is determined. Although an actual crucible temperature generally has a distribution of high and low temperatures depending on the position of the measurement, an inner temperature of crucible is homogenized by heat transfer through convection of molten silicon, therefore, it is not substantially influenced by the temperature measuring position. Accordingly, the temperature can be represented by a temperature measured at one point by a temperature sensor such as a thermocouple or blackbody thermometer set directly underneath quartz crucible on a crucible rotation shaft. In this respect, see Japanese Unexamined Patent Publication S56-125296 and Japanese Unexamined Patent Publication H06-298593.

The contact area ratio $\beta$ is the ratio of the contact area of molten silicon with atmospheric gas, divided by the contact area of molten silicon with an inner wall of the crucible. The value is a necessary indicator to determine the transfer balance of oxygen during the pulling of the crystal. The value $\beta$ can be geometrically calculated based on the geometrical shape of the inner surface of the quartz crucible in use, and the melt volume employed in the pulling of the crystal. Here, the melt volume can be calculated by subtracting the weight of the crystal pulled from the weight of silicon feedstock, or by converting the change of load on the crucible rotation shaft from the load prior to pulling. The denominator in the equation, i.e., the contact area of molten silicon with an atmospheric gas is a value obtained by subtracting the cross section of the crystal from the area of melt surface corresponding to the melt amount during crystal pulling. Additionally, the contact area ratio $\beta$ is a parameter having a physical meaning different from a crystal solidification ratio (see H05-262593) and a pulled crystal length (see H10-167881), which are controlling parameters in the conventional method of oxygen concentration adjustment.

Crucible rotation rate $\Omega$ is a parameter which determines the thickness of the boundary flow layer formed at the interface of the melt contacting a crucible surface by rotation of the quartz crucible. The change in thickness of the boundary flow layer reflects a change in the rate of oxygen transfer to the melt from the crucible surface. Accordingly, it is thought that $\Omega$ is an essential indicator in determining the transfer balance of oxygen in a crystal. The value of $\Omega$ can be measured with an encoder or transducer set up on the crucible rotation shaft.

In the present invention, the oxygen concentration introduced into the crystal at the growth surface of the crystal is adjusted through use of the foregoing three control parameters during crystal growth, each of the parameters and the oxygen concentration in the crystal correlated by the following formula (1):

$$O_p(\Omega,T,\beta)=A \times F(\Omega) \times G(T) \times H(\beta)+B,$$

where A is a conversion constant, B is a constant, and F, G and H are functions of crucible rotation rate $\Omega$, crucible temperature T, and contact area ratio $\beta$, respectively. Characteristics of functions of F, G and H with respect to $\Omega$, T and $\beta$ are, for example, given in a power-law form with respective constants of f, g and h as follows:

$$F(\Omega)=\Omega^{0.5}+f$$

$$G(T)=T+g$$

$$H(\beta)=\beta^{-1}+h \quad \text{[Equation (2)]}$$

The oxygen concentration $O_p$ in the crystal can be estimated by substituting respective operational parameters $\Omega$, T, $\beta$ from an actual crystal growth into Equations (1) and (2). Additionally, in Equation (2), since the function G (T) is believed to be proportional to the dissolution rate of the quartz crucible into molten silicon, then expressing a dissolution energy of quartz into silicon as E, it is reasonable that:

$$G(T)=\text{Exp}(-E/T) \quad \text{[Equation (3)]}$$

Further, by putting function H ($\beta$) with h=0, oxygen concentration becomes a simple form which is inversely proportional to the ratio of the area $\beta$. In this case, a function I ($\beta$, T) of H ($\beta$) multiplied by G (T) takes the following form.

$$I(\beta,T)=1/\beta \, \text{Exp}(-E/T) \quad \text{[Equation (4)]}$$

This function I ($\beta$, T) is an equation estimating oxygen concentration in the melt in a boundary layer model by Hoshikawa and Hirata (Japanese Association for Crystal Growth Corporation Vol. 15.2 (1988), p. 215), equation (14)) corresponding to an approximate expression under the following conditions: oxygen concentration $C_s$ of the part contacting a surface of quartz crucible is larger than the oxygen concentration Ca on a free surface of melt (Ca>Cs); ratio a of thickness of the oxygen concentration boundary layer of the melt to the surface of the quartz crucible and thickness of the oxygen concentration boundary layer to a free surface is sufficiently smaller than the contact area ratio $\beta(\alpha<<\beta)$. Namely, using the following Equation (5) expressing an approximate oxygen concentration in the melt, the oxygen concentration in the crystal can be estimated in a more precise way.

$$O_p(\Omega,T,\beta)=A \times F(\Omega) \times 1/\beta \times \text{Exp}(-E/T)+B \quad \text{[Equation (5)]}$$

Then, when the crystal oxygen concentration $O_p$ estimated by Equations (1) or (5) differs from a stipulated quality value of oxygen concentration, the crucible rotation rate $\Omega$ and crucible temperature T may be changed suitably during the growth of the crystal to satisfy the following Equation (6).

$$|O_p(\Omega,T,\beta)-O_t(\beta)| \leq \Delta \quad \text{[Equation (6)]}$$

where $\Delta$ is an acceptable variation of oxygen concentration of the growing portion of the crystal, and which is determined by a quality specification.

As described above, three parameters are controlled during the growth of the crystal according to Equations (1) or (5), or Equation (6), which can always place the oxygen concentration of crystal within a quality specification.

In this respect, while crucible rotation rate can be changed directly from a panel of the furnace, there is the problem that the crucible temperature cannot be directly set up from the panel. For this problem, the crucible temperature is indirectly controlled by adjusting the heater power in order to maintain the growing crystal at a constant diameter through changing each of operational parameters by the several methods below listed:

(1) The power of the heaters for heating the crucible is adjusted. For example, when a crucible is equipped with two kinds of heaters, for example a heater for heating the side wall (main heater) and a heater for heating the bottom of crucible (auxiliary heater), the power supply to the main heater is decreased while raising the power supplying to the auxiliary heater to raise the temperature of crucible, so as not to decrease the crystal diameter in pulling-up.

(2) The relative position between the crucible and the heater is adjusted. In this method, a crucible may be moved up and down, or a mechanism for directly moving the main heater may be employed (see Japanese Unexamined Patent Publication H06-219887).

(3) The crystal growth rate is adjusted. In this method, because of the heat released during solidification in response to the change of crystal growth rate, a change in heater output is required to maintain the crystal diameter, so the crucible temperature can be indirectly increased or decreased by changing the heater output.

(4) The crucible rotation rate is changed. Changing the rate of rotation lowers heat transfer into melt due to suppression of convection of the melt due to the increase of the rotational moment of the melt. When the crucible rotation rate increases, heat transfer into the crystal from melt is lowered, so it is necessary to increase the heater output to maintain the crystal diameter, thus indirectly raising the crucible temperature. However, it should also be considered that the crucible rotation rate depends not only on the crucible temperature but also on the thickness of flow boundary layer described above, which affects the oxygen concentration.

According to the production process of the present invention, a silicon single crystal with a uniform distribution of oxygen concentration can be produced in a high yield without being affected by changes such as crystal diameter and initial amount of melt feedstock.

FIG. 1 is a schematic view depicting one embodiment of production apparatus used for producing a silicon single crystal according to the production process of the present invention. The production apparatus 1 is equipped with a pulling furnace 2, a crucible shaft 3 passing through the bottom center of the pulling furnace 2, a quartz crucible 4 on top of the crucible shaft 3, a main heater 5 in a ring shape for heating the quartz crucible 4 from its periphery, an auxiliary heater 6 in a ring shape surrounding the crucible shaft 3, a crucible support drive mechanism 7 for hoisting and rotating the crucible shaft 3, a seed chuck 9 holding a seed crystal 8, a pulling wire 10 suspending the seed chuck 9, a wire winding mechanism 11 for winding the pulling wire 10, and a controller 12. Also depicted are a silicon single crystal 13 being grown, and molten silicon 14 inside the quartz crucible 4. The silicon single crystal 13 is pulled up by gradually winding the pulling wire 10 in concert with the rate of crystal growth from molten silicon.

The crucible support drive mechanism 7 is equipped with a crucible rotating servomotor 7a and crucible hoisting servomotor 7b. The wire winding mechanism 11 is equipped with a wire winding servomotor 11a and a load cell 11b.

Additionally, inside the furnace 2, there are a thermocouple (or blackbody thermometer) 15 for measuring the temperature of the quartz crucible 4 and a radiation thermometer 16 for measuring the radiant heat (heater temperature) inside the furnace 2. The thermocouple 15 is set on the outer surface of the quartz crucible 4. The radiation thermometers 16 are set in the peripheries of the main heater 5 and auxiliary heater 6. To the main heater 5 and auxiliary heater 6, power is supplied from respective sources 5a and 6a.

To the controller 12 are inputted measurements of temperature by the thermocouple 15, measurements of weight by the load cell 11b, and rotation rate of the crucible rotating servomotor 7a. On the basis of this input data, the controller 12 regulates the crucible rotating servomotor 7a, crucible hoisting servomotor 7b, the power source of the main heater 5a, the power source of the auxiliary heater 6a, the wire winding servomotor 11a, and the like.

Figure 2:
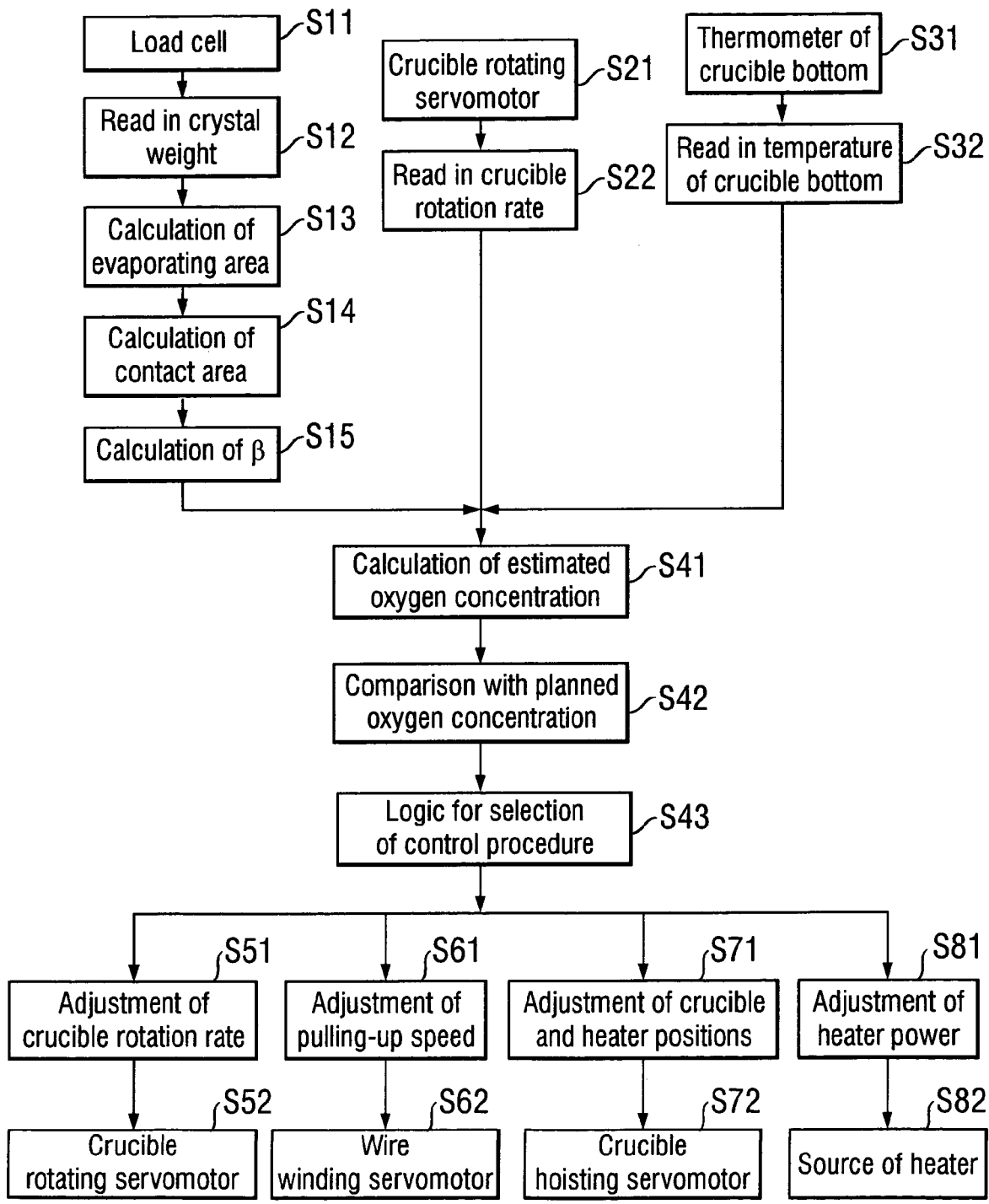
FIG. 2 is a flow diagram showing a control procedure of various operational parameters in the pulling of a silicon single crystal.

FIG. 2 is a flow diagram showing a control procedure of various operational parameters in pulling-up of silicon single crystal. According to the diagram, the controller 12 controls respective operational parameters such as crucible rotation rate, pulling-up speed of the crystal, and heater power from the start point of the growth of single crystal constant diameter part to the end point.

The controller 12 particularly performs the following procedures. First, the controller 12 reads in measurements of weight by the load cell 11b, and via calculations of evaporating area and contact area, calculates a ratio $\beta$ of contact area (S11 to S15). In addition, it reads in the rotation rate $\Omega$ of crucible rotation servomotor 7a (crucible rotation rate) (S21 and S 22). In addition, it reads in measurements of temperature (crucible temperature) T by the thermocouple 15 (thermometer of crucible bottom) (S31 and S32).

Next, the controller 12 calculates an estimated oxygen concentration $O_p$ ($\Omega$, T, $\beta$) (S41) by using the ratio $\beta$ of contact area, crucible rotation rate $\Omega$ and crucible temperature T obtained from the respective steps of S15, S22 and S32. The Equations (1) and (5) are used for this calculation. It next compares the estimated oxygen concentration $O_p$ ($\Omega$, T, $\beta$) calculated in S41 step with a stipulated quality value $O_t$ (S42), and based on the comparison results in the step of S42, it selects a control means (S43). Then, based on the control means selected in the step of S43, it controls the crucible rotating servomotor 7a (S51 and S52), wire winding servomotor 11a (S61 and S62), crucible hoisting servomotor 7b (S71 and S72), heater source 5a, 18S (S81 and S82) and the like.

Examples and a Comparative example of the present invention are described below.

Comparative Example 1

Figure 3:
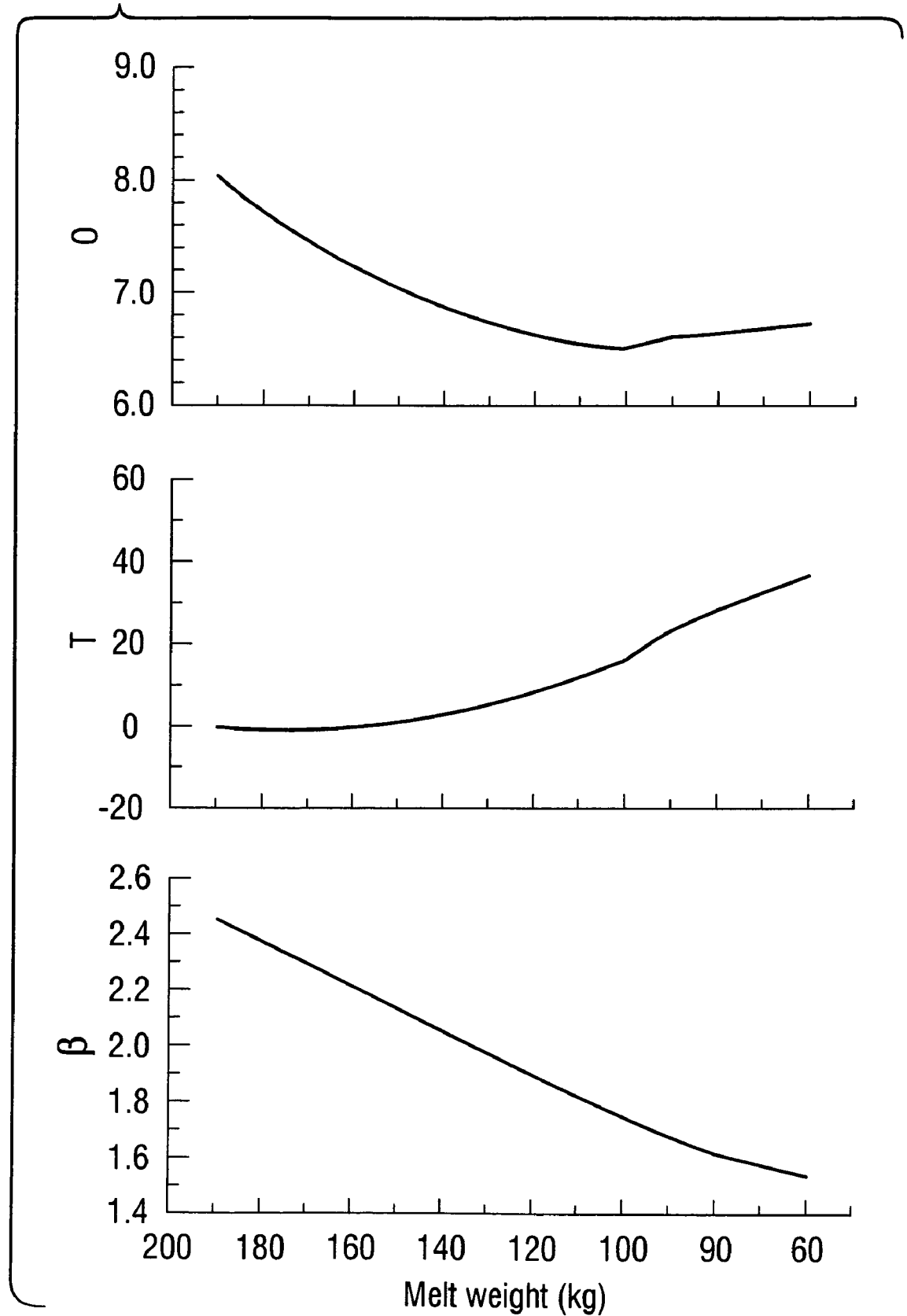
FIG. 3 illustrates the relationship between operational parameters (T and $\beta$) and oxygen concentration (O) in a Comparative example.

As a comparative example, no changes are performed on control parameters such as crucible rotation rate, crystal growth rate, relation between heater and crucible positions, and power distribution of each heater. FIG. 3 shows the following measurements versus the change of melt weight in the growth: contact area ratio $\beta$, crucible temperature T, oxygen concentration in a crystal of 12 inch diameter grown from a melt of 200 kg of polycrystalline silicon in a quartz crucible with 28 inch diameter. The crucible temperature T therein is expressed as a difference from the crucible temperature in the growth of the top of a constant diameter part.

The oxygen concentration of the constant diameter part of the crystal decreased gradually from the top of the crystal, although it increased somewhat at the end of constant diameter part (in the decreased residual melt) and exhibited a large change corresponding to 20% of the average oxygen concentration across the entire length of the constant diameter part. It is believed that the changes are due to a large decrease in the contact area ratio β up to the middle period of growth, and due to the influence of an increase of crucible temperature in the latter period of crystal pulling. It is thus necessary to control the contact area ratio β and the crucible temperature T in order to homogenize the oxygen concentrations in crystal.

Example 1

A 12 inch crystal is grown in the same furnace and furnace charge as in Comparative example 1. In order to produce a crystal having a uniform oxygen concentration of $8.0 \times 10 \, E^{17}$ (atoms/cm$^3$), the crucible temperature was controlled by changing the crucible rotation rate during growth of the crystal. Specifically, the crucible rotation rate was kept low in the initial stage of single crystal pulling-up, and toward the latter stage of growth it was increased or decreased according to the flow chart shown in FIG. 2. Each of the functions of F, G and H used in the control equation (1) for oxygen concentration is in the form below:

$$F(\Omega) = \Omega^{0.5}$$

$$G(T) = T = g$$

$$H(\beta) = \beta^{-1} \qquad \text{[Equation (7)]}$$

Constants of A, B and g were determined by a least square method from the operational conditions in Example 1 and the actual oxygen concentrations of the crystal obtained therein.

Figure 4:
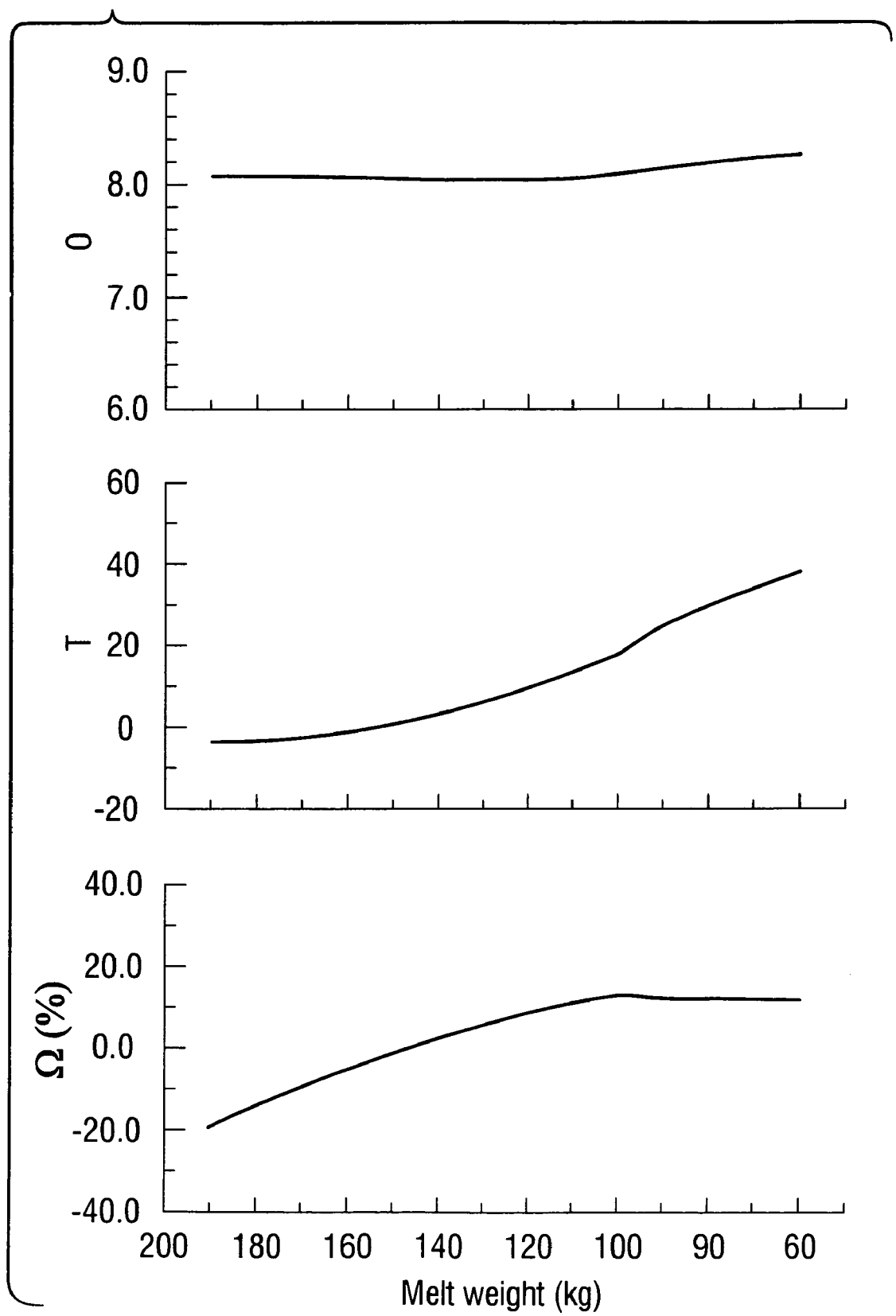
FIG. 4 illustrates the relationship between operational parameters (T and O) and oxygen concentration (O) in subject invention Example 1.

FIG. 4 shows the changes of crucible rotation rate Ω and crucible temperature T. The crucible rotation rate Ω therein is reported as a percentage of the rotation rate in Comparative example 1, and the crucible temperature T represents a difference from the crucible temperature in the growth of top of the constant diameter part of the crystal in Comparative example 1.

The crucible temperature T in Example 1 and crucible rotation rate of Comparative example 1 are raised to compensate for the decrease in the contact area ratio β shown in FIG. 4. As a result, a crystal having a deviation within 4% from an oxygen concentration target value of $8.0 \times 10 \, E^{17}$ (atoms/cm$^3$) across the entire length of the constant diameter part of the crystal was obtained.

Example 2

In Example 2, the process of Comparative example 1 was used, but in order to make the oxygen concentration uniformly $8.0 \times 10 \, E^{17}$ (atoms/cm$^3$), the crucible temperature T was controlled by changing the crucible rotation rate Ω during crystal growth as in Example 1. Specifically, the crucible rotation rate Ω was kept low in the initial stage of single growth, and toward the latter stage of growth it was increased or decreased according to the flow chart shown in FIG. 2. Each of the functions of F and I used in the estimate equation (5) for oxygen concentration is in the form below:

$$F(\Omega) = \Omega^{0.5}$$

$$I(T) = 1/\beta \times \text{Exp}(-E/T)$$

Additionally, value E was 24,000 (K), from T. Carberg, J. ELECTROCHEM. SOC., vol. 133, No. 9, p. 1940. The values of constants A and B were determined by a least square method from the operational conditions in Example 1 and the measured oxygen concentrations of crystal. The error by the least square method is half of that obtained in Example 1 and the precision of approximation using this equation was better than that in Example 1.

Figure 5:
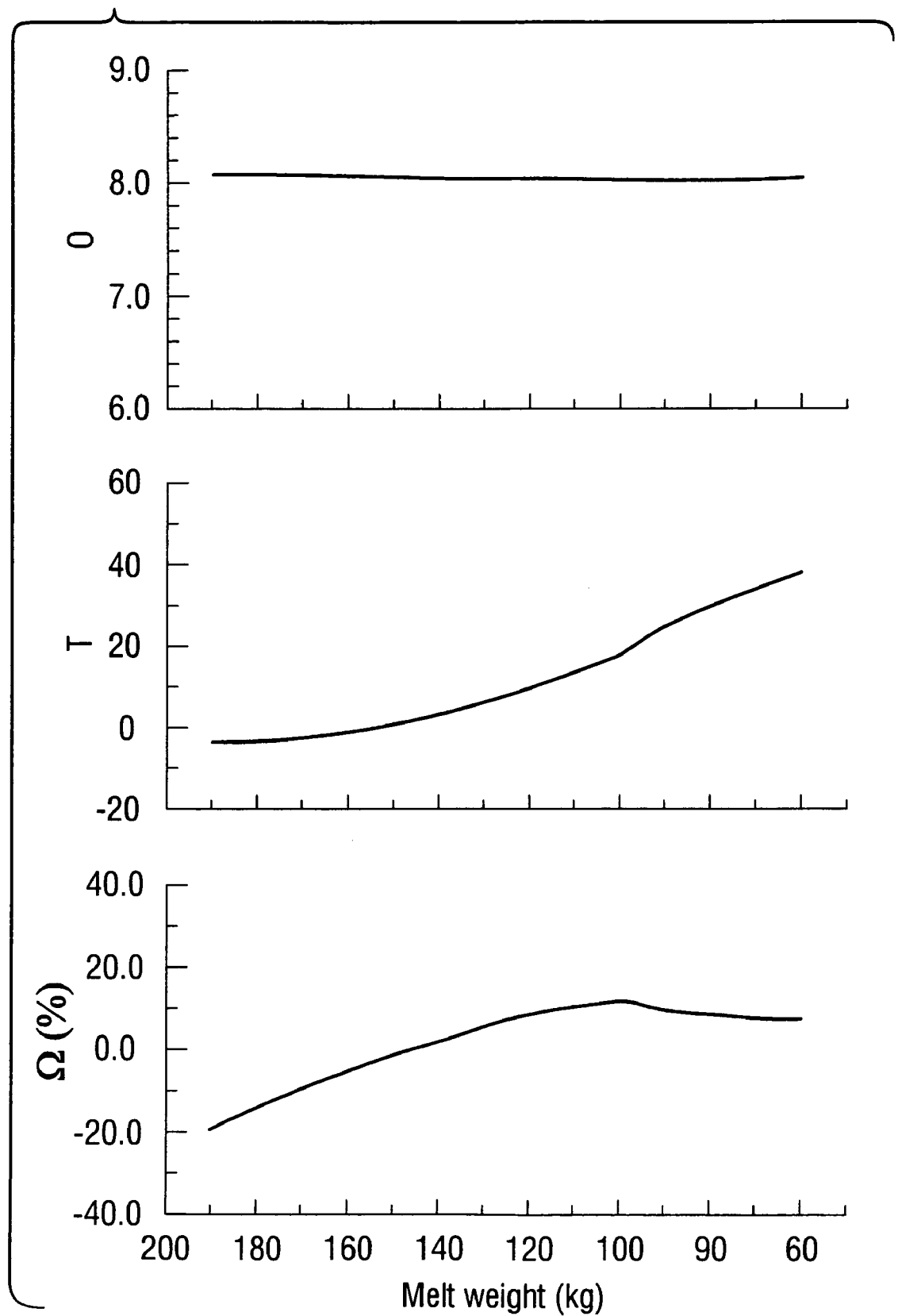
FIG. 5 illustrates the relationship between operational parameters (T and O) and oxygen concentration (O) in subject invention Example 2.

FIG. 5 shows the changes of crucible rotation rate Ω and crucible temperature T. The crucible rotation rate Ω therein represents a percentage of the rotation rate in Comparative example 1, and the crucible temperature T represents a difference from the crucible temperature in the growth of top of the constant diameter part of the crystal in Comparative example 1.

The crucible temperature T in Example 2 and the crucible rotation rate Ω were able to compensate for the decrease of the ratio β of contact area in Comparative example 1. As a result, a crystal with a uniformity of oxygen concentration superior to that in Example 1 was obtained, having a deviation within 2% from a target value of oxygen concentration of $8.0 \times 10 \, E^{17}$ (atoms/cm$^3$) across the entire length of the constant diameter part of the crystal.

Example 3

In Example 3, in an initial stage of crystal growth, the change of crucible rotation rate Ω was performed in the same pattern as in Example 2, from the midstream of growth, the crucible rotation rate Ω was fixed at the same rotation rate as in Comparative example 1, and then, a change of crucible temperature T was made by adjusting power supplying to the auxiliary heater 6. In addition, Equation (5) was used as an estimate equation with the same functions F and I used as in Example 2 and also with constants A, B and E used as in Example 2.

Figure 6:
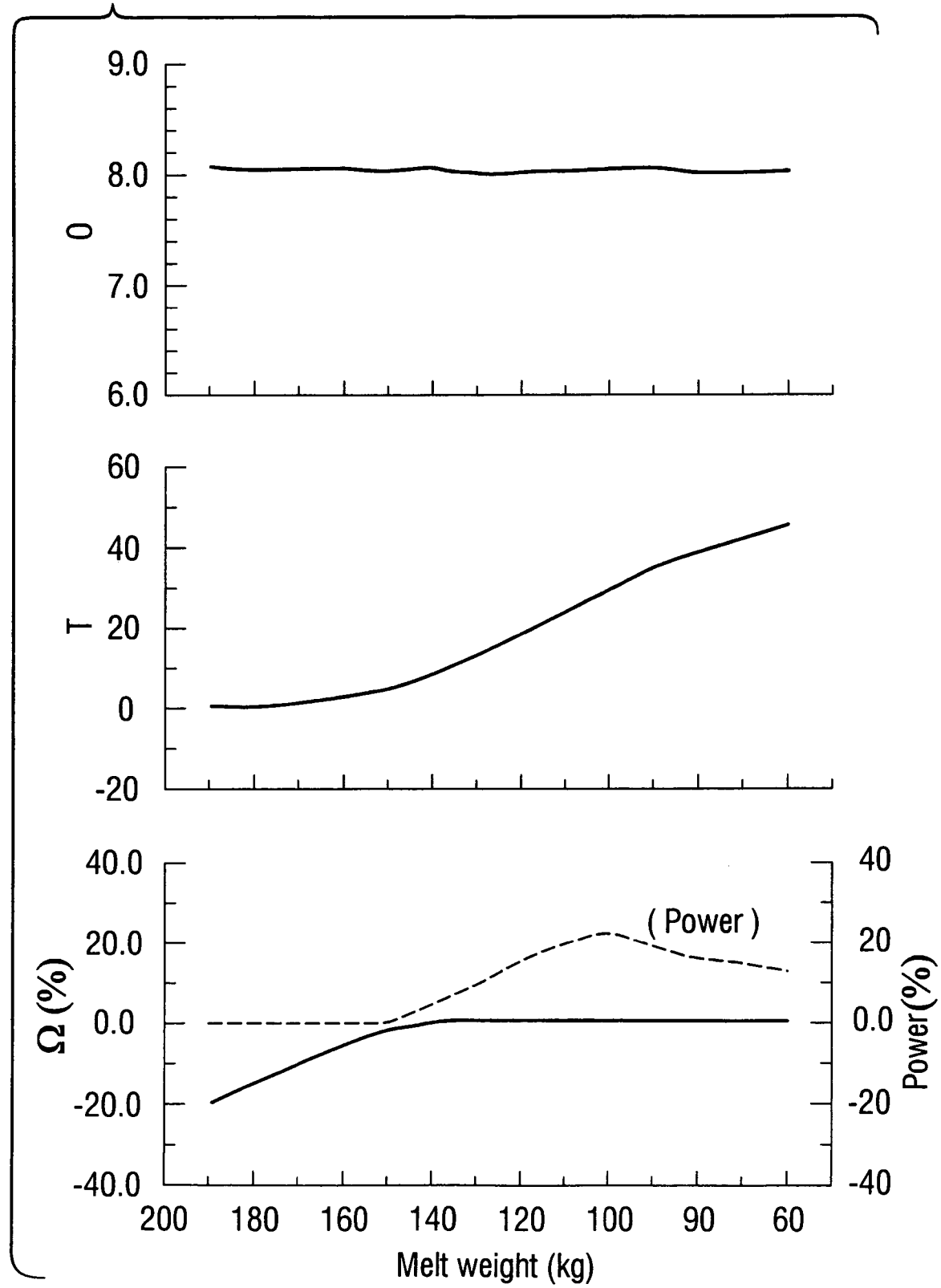
FIG. 6 illustrates the relationship between operational parameters (T, O and Power) and oxygen concentration (O) in subject invention Example 3.

FIG. 6 shows the changes of the operational parameters (crucible rotation rate Ω and power to the auxiliary heater 18S) and crucible temperature T. The crucible rotation rate Ω and power to the auxiliary heater 18S therein represent percentages of the values of Comparative example 1, and the crucible temperature T represents a difference from the crucible temperature in the growth of the top of the constant diameter part of the crystal in Comparative example 1.

The crucible temperature T in Example 3 was also raised to compensate for the decrease of the contact area ratio β. As a result, a crystal having a deviation within 2% from a target value of oxygen concentration of $8.0 \times 10 \, E^{17}$ (atoms/cm$^3$) across the entire length of constant diameter part was obtained.

Example 4

In Example 4, in the initial stage of crystal growth, the change of crucible rotation rate Ω was performed in the same pattern as in Example 2. From the midstream of growth, however, the crucible rotation rate Ω was fixed at the same rotation rate as in Comparative example 1, and then, a change in crucible temperature T was made by changing the relative position between the main heater 5 and melt surface using the crucible shaft hoisting servomotor 7b. In addition, Equation (5) was used as an estimate equation with the same functions F and I used as in Example 2 and also with constants A, B and E used as in Example 2.

Figure 7:
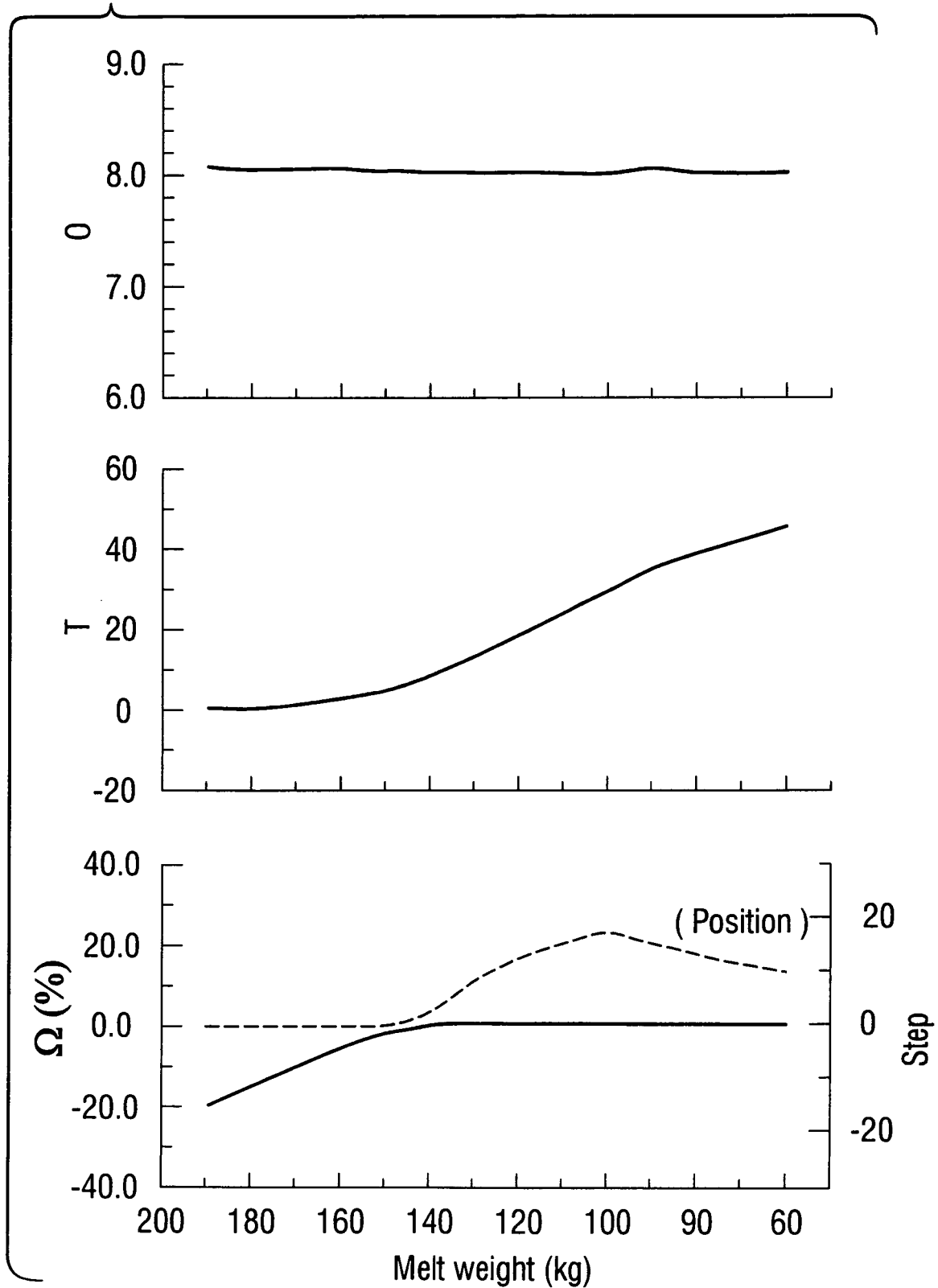
FIG. 7 illustrates the relationship between operational parameters (T, O and Position) and oxygen concentration (O) in subject invention Example 4.

FIG. 7 shows the changes of each of operational parameters (crucible rotation rate Ω and crucible position Step) and crucible temperature T. The crucible rotation rate Ω therein represents a percentage of the rotation rate in Comparative example 1, and the crucible position Step represents the movement step number of the crucible hoisting servomotor 7b from Comparative example 1. The crucible temperature T represents a difference from the crucible temperature in the growth of the top of the constant diameter part of the crystal in Comparative example 1. The crucible temperature T in Example 4 was raised to compensate for the decrease of the ratio β of contact area, and as a result, a crystal having a deviation within 2% from a target value of oxygen concentration of $8.0 \times 10$ $E^{17}$ (atoms/cm$^3$) across the entire length of the constant diameter part of the crystal was obtained.

Example 5

In Example 5, in an initial stage of crystal growth, a change of crucible rotation rate Ω was performed in the same manner as in Example 2. However, from the midstream of growth, the crucible rotation rate Ω was fixed at the same rotation rate as in Comparative example 1, and then, a change of crucible temperature T was made by changing the crystal growth rate. In addition, Equation (5) was used as an estimate equation with the same functions F and I used as in Example 2 and also with constants A, B and E used as in Example 2.

Figure 8:
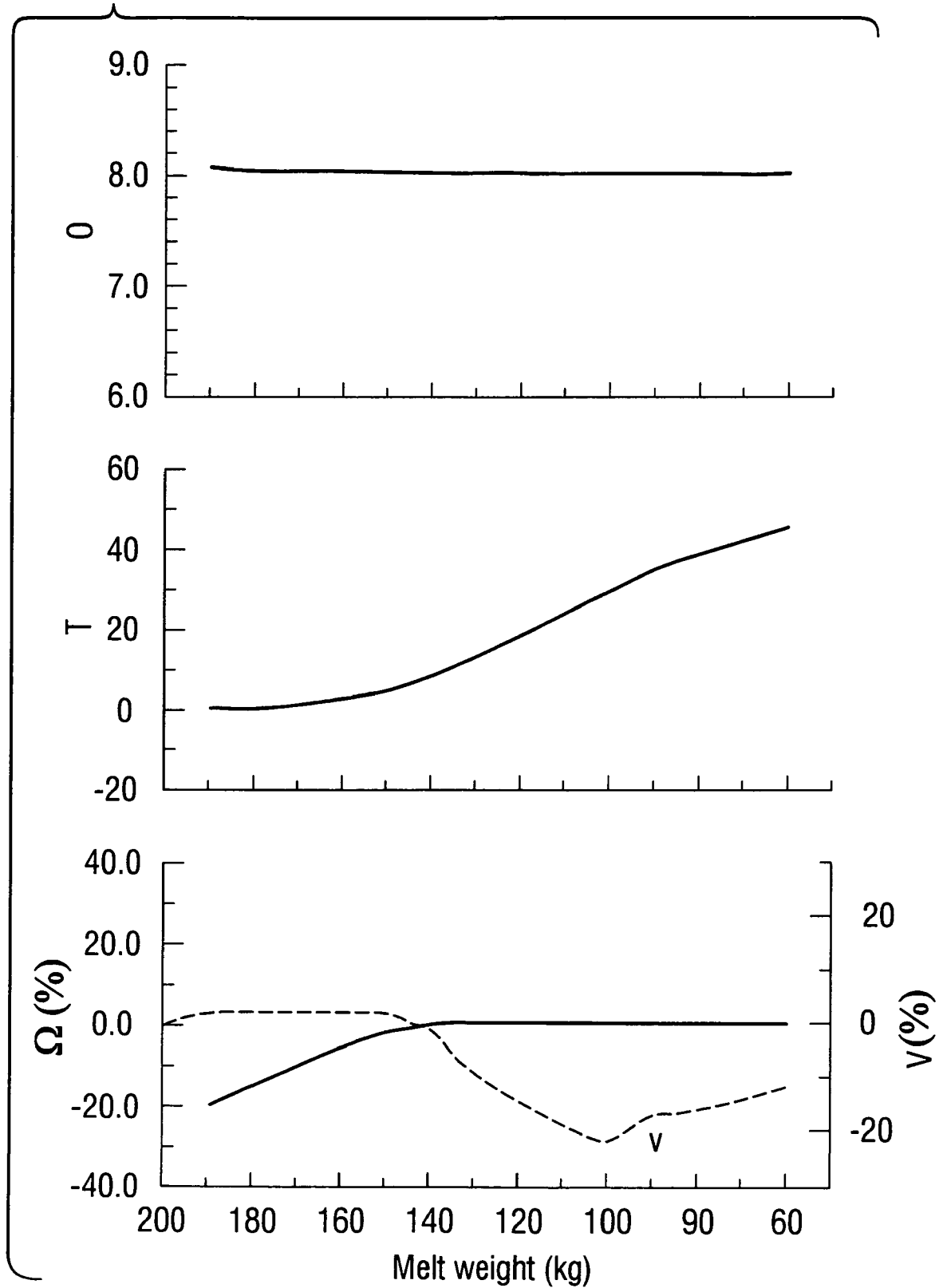
FIG. 8 illustrates the relationship between operational parameters (T, O and V) and oxygen concentration (O) in subject invention Example 5.

FIG. 8 shows the changes of each of the operational parameters (crucible rotation rate Ω and crystal growing rate) and crucible temperature T. The crucible rotation rate Ω and crystal growing rate therein represent percentages of those values in Comparative example 1, and the crucible temperature T represents a difference from the crucible temperature at the top of the constant diameter part of the crystal in Comparative example 1. The crucible temperature T in Example 5 was raised to compensate for the decrease in the contact area ratio β. As a result, a crystal having a deviation within 2% from a target value of oxygen concentration of $8.0 \times 10$ $E^{17}$ (atoms/cm$^3$) across the entire length of the constant diameter part of the crystal was obtained.

Example 6

In Example 6, instead of the oxygen concentration of $8.0 \times 10$ $E^{17}$ (atoms/cm$^3$) obtained in Example 3, the aim was to obtain a crystal with a higher oxygen concentration of $9.0 \times 10$ $E^{17}$ (atoms/cm$^3$). To do so, the change in crucible rotation rate Ω was performed as in Example 3 to promote oxygen to elute from the crucible at a higher crucible temperature T than that in Example 2 by changing power to the auxiliary heater 6. In addition, Equation (5) was used as an estimate equation with the same functions F and I used as in Example 2 and also with constants A, B and E used as in Example 2.

Figure 9:
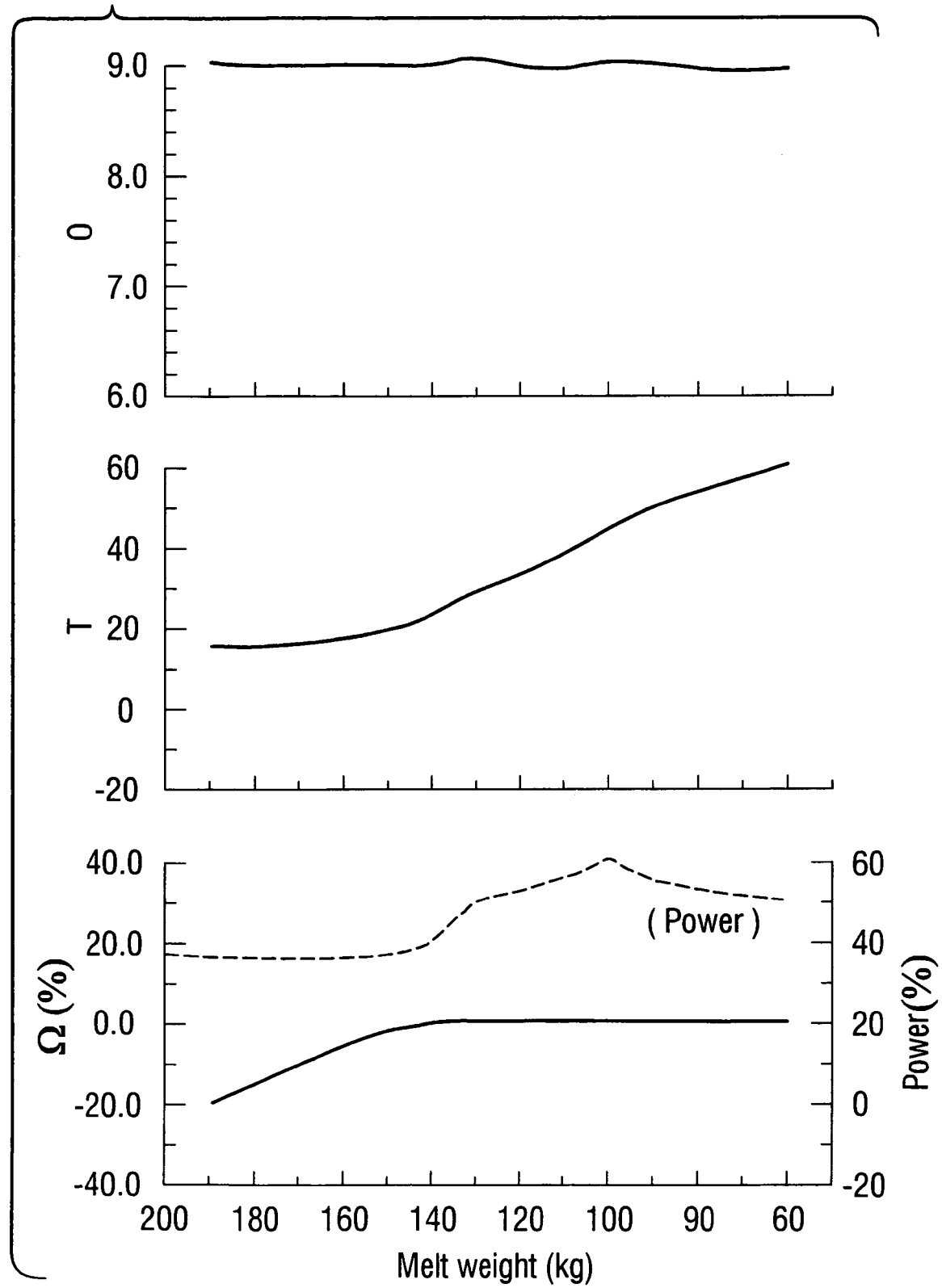
FIG. 9 illustrates the relationship between operational parameters (T, O and Power) and oxygen concentration (O) in subject invention Example 6.

FIG. 9 shows the changes of each of operational parameters (crucible rotation rate Ω and power to the auxiliary heater 6) and crucible temperature T. The crucible rotation rate Ω and power to the auxiliary heater 6 therein represent percentages of the values in Comparative example 1, and the crucible temperature T represents a difference from the crucible temperature at the top of the constant diameter part of the crystal in Comparative example 1. The crucible temperature T in Example 6 was raised to compensate for the decrease of the contact area ratio β. As a result, a crystal having a deviation within 2% from a target value of oxygen concentration of $9.0 \times 10$ $E^{17}$ (atoms/cm$^3$) across the entire length of the constant diameter part of the crystal was obtained.

Example 7

In Example 7, instead of the oxygen concentration of $8.0 \times 10$ $E^{17}$ (atoms/cm$^3$) obtained in Example 3, the aim was to obtain a crystal with a lower oxygen concentration of $7.0 \times 10$ $E^{17}$ (atoms/cm$^3$). To do so, the change in crucible rotation rate Ω was performed as in Example 3, to suppress the oxygen eluted from crucible at a lower crucible temperature T than that in Example 2 by changing power to the auxiliary heater 6a. In addition, Equation (5) was used as an estimate equation with the same functions F and I used as in Example 2 and also with constants A, B and E used as in Example 2.

Figure 10:
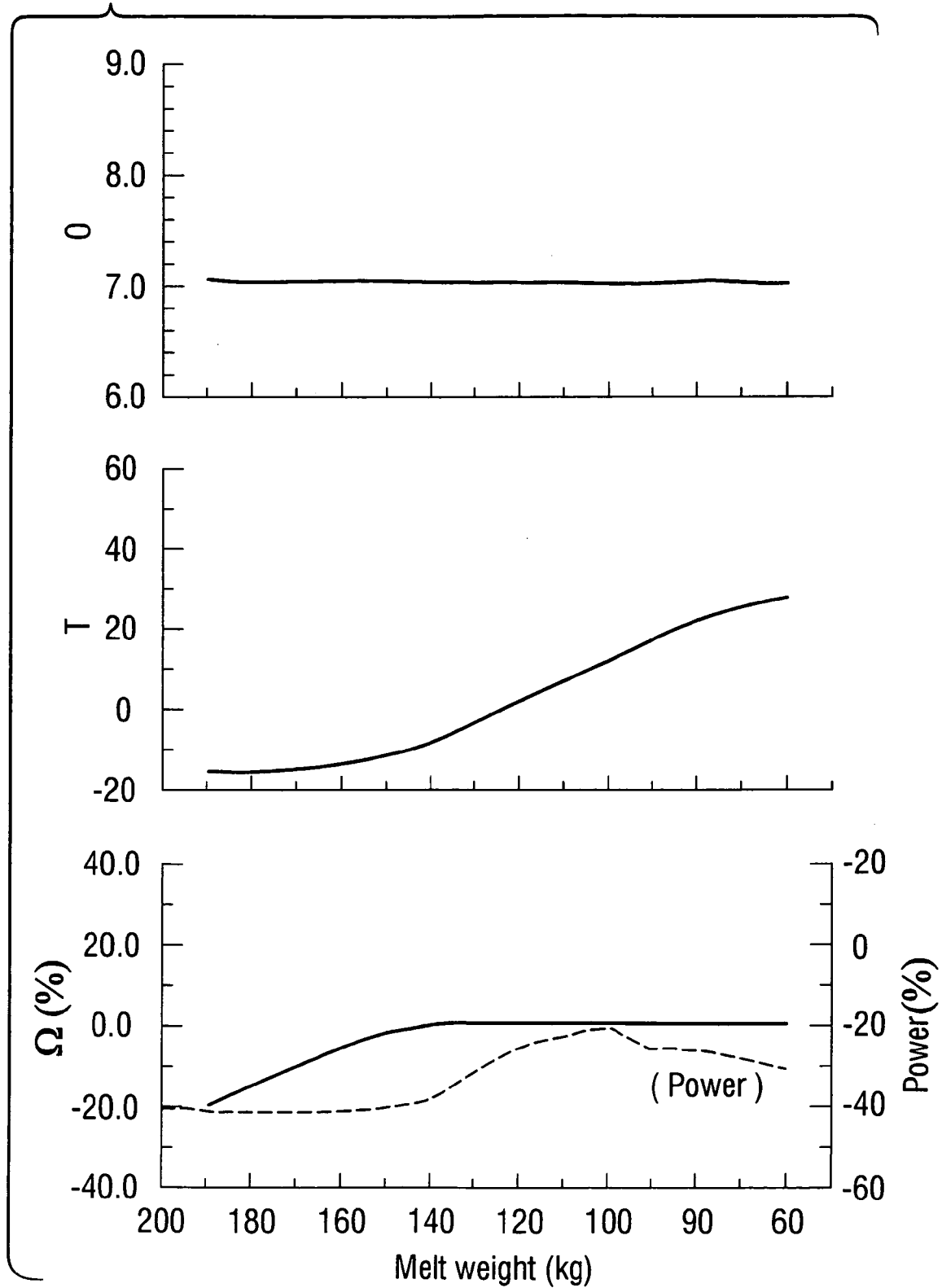
FIG. 10 illustrates the relationship between operational parameters (T, O and Power) and oxygen concentration (O) in subject invention Example 7.

FIG. 10 shows the changes of each of the operational parameters (crucible rotation rate Ω and power to the auxiliary heater 6) and crucible temperature T. The crucible rotation rate Ω and power to the auxiliary heater 18S therein represent percentages of the values in Comparative example 1, and the crucible temperature T represents a difference from the crucible temperature at the top of the constant diameter part of the crystal in Comparative example 1. The crucible temperature T in Example 7 was raised to compensate for the decrease of the contact area ratio β. As a result, a crystal having a deviation within 2% from a target value of oxygen concentration of $7.0 \times 10$ $E^{17}$ (atoms/cm$^3$) across the entire length of the constant diameter of the crystal was obtained.

As described above, in the production process of the present invention, attention is focused on the discovery that the distribution of oxygen concentration in the axial direction of silicon single crystal depends on crucible rotation rate, crucible temperature, contact areas of molten silicon with quartz crucible 4 and atmospheric gas, and as a parameter controlling the crucible temperature T, any one of crucible rotation rate, heater output, and crystal pulling speed, or a combination thereof can be used. According to the production process, the distribution of oxygen concentration in the axial direction of silicon single crystal can be homogenized and the production yield of silicon single crystals can be improved. Additionally, using the ratio β of contact area as a control indicator instead of crystal length, solidification rate of melt or melt amount in pulling-up, which are used in the conventional methods, the process has an advantage that is not affected by changes in crystal diameter or initial amount of melt feedstock.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for producing a silicon single crystal by the Czochralski method using a quartz crucible, comprising: estimating an oxygen concentration $O_p(\Omega,T,\beta)$ in the silicon single crystal during growth, wherein Ω represents a crucible rotation rate, T represents a crucible temperature, and β represents a contact area ratio of molten silicon with an inner wall of crucible and a contact area of molten silicon with an atmospheric gas; estimating the oxygen concentration $O_p(\Omega,T,\beta)$ by using the formula $O_p(\Omega,T,\beta)=A \times F(\Omega) \times 1/\beta \times Exp(-E/T)+B$, wherein A and B represent constants, F represents a function of the crucible rotation rate Ω and E represents the dissolution energy of quartz into silicon and controlling at least one of the crucible rotation rate (Ω) and the crucible temperature (T) to satisfy the formula $|O_p(\Omega,T,\beta)-O_t(\beta)| \leq \Delta$, wherein $O_t$ is a target oxygen concentration in the single crystal and Δ is an acceptable variation of the oxygen concentration in the growing part of the single crystal.

2. The process of claim 1, wherein the crucible rotation rate (Ω) is controlled in response to changes in the ratio (β) and the temperature (T).

3. The process of claim 1, wherein power supplied to a heater heating the crucible is controlled in response to changes of the crucible rotation rate ($\Omega$) and the ratio ($\beta$).

4. The process of claim 1, wherein a relative position between the crucible and the heater heating the crucible is controlled in response to changes in the rotation rate ($\Omega$) and/or the ratio ($\beta$).

5. The process of claim 1, wherein the growth rate of a silicon single crystal is controlled in response to changes of the crucible rotation rate ($\Omega$) and/or the ratio ($\beta$).

6. The process of claim 1, wherein all of the crucible rotation rate ($\Omega$), the power supplied to a heater heating the crucible, and the relative position of the heater and crucible are all altered during growing of the single crystal to satisfy the formula $|O_p(\Omega,T,\beta)-O_t(\beta)| \leqq \Delta$.

7. The process of claim 1, wherein the longitudinal variation of oxygen concentration along a constant diameter portion of the single crystal is within 4%.

8. The process of claim 1, wherein the longitudinal variation of oxygen concentration along a constant diameter portion of the single crystal is within 3%.

* * * * *

UNITED STATES PATENT AND TRADEMARK OFFICE
CERTIFICATE OF CORRECTION

PATENT NO.       : 7,582,160 B2
APPLICATION NO.  : 11/451989
DATED            : September 1, 2009
INVENTOR(S)      : Kishida et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 472 days.

Signed and Sealed this

Fourteenth Day of September, 2010

David J. Kappos
*Director of the United States Patent and Trademark Office*